United States Patent
Wu et al.

(10) Patent No.: US 10,163,965 B1
(45) Date of Patent: Dec. 25, 2018

(54) CMOS IMAGE SENSOR, A PHOTODIODE THEREOF AND A METHOD OF FORMING THE SAME

(71) Applicant: Himax Imaging Limited, Tainan (TW)

(72) Inventors: Yang Wu, Tainan (TW); Inna Patrick, Tainan (TW)

(73) Assignee: Himax Imaging Limited, Tainan (TW)

( * ) Notice: Subject to any disclaimer, the term of this patent is extended or adjusted under 35 U.S.C. 154(b) by 6 days.

(21) Appl. No.: 15/629,461

(22) Filed: Jun. 21, 2017

(51) Int. Cl.
*H01L 31/0352* (2006.01)
*H01L 31/18* (2006.01)
*H01L 27/146* (2006.01)

(52) U.S. Cl.
CPC .... *H01L 27/14643* (2013.01); *H01L 27/1463* (2013.01); *H01L 27/14612* (2013.01); *H01L 27/14689* (2013.01)

(58) Field of Classification Search
CPC .. H01L 27/14645–27/14647; H01L 27/14689; H01L 27/1461
See application file for complete search history.

(56) References Cited

U.S. PATENT DOCUMENTS

| | | | | |
|---|---|---|---|---|
| 2008/0001192 A1* | 1/2008 | Inoue | ............... | H01L 27/14603 257/291 |
| 2013/0175582 A1* | 7/2013 | Ihara | .................. | H01L 27/1461 257/222 |
| 2016/0093659 A1* | 3/2016 | Nakamura | ........ | H01L 27/14614 250/208.1 |

* cited by examiner

*Primary Examiner* — Changhyun Yi
(74) *Attorney, Agent, or Firm* — Donald E. Stout; Stout, Uxa & Buyan, LLP

(57) ABSTRACT

A photodiode (PD) of a complementary metal-oxide-semiconductor (CMOS) image sensor includes a top PD of a second type disposed in a first-type layer; and a bottom PD of the second type disposed in the first-type layer and below the top PD, the bottom PD including at least one sub-photodiode (sub-PD) of the second type connected to the top PD and at least one sub-well of the first type surrounded by the at least one sub-PD.

6 Claims, 4 Drawing Sheets

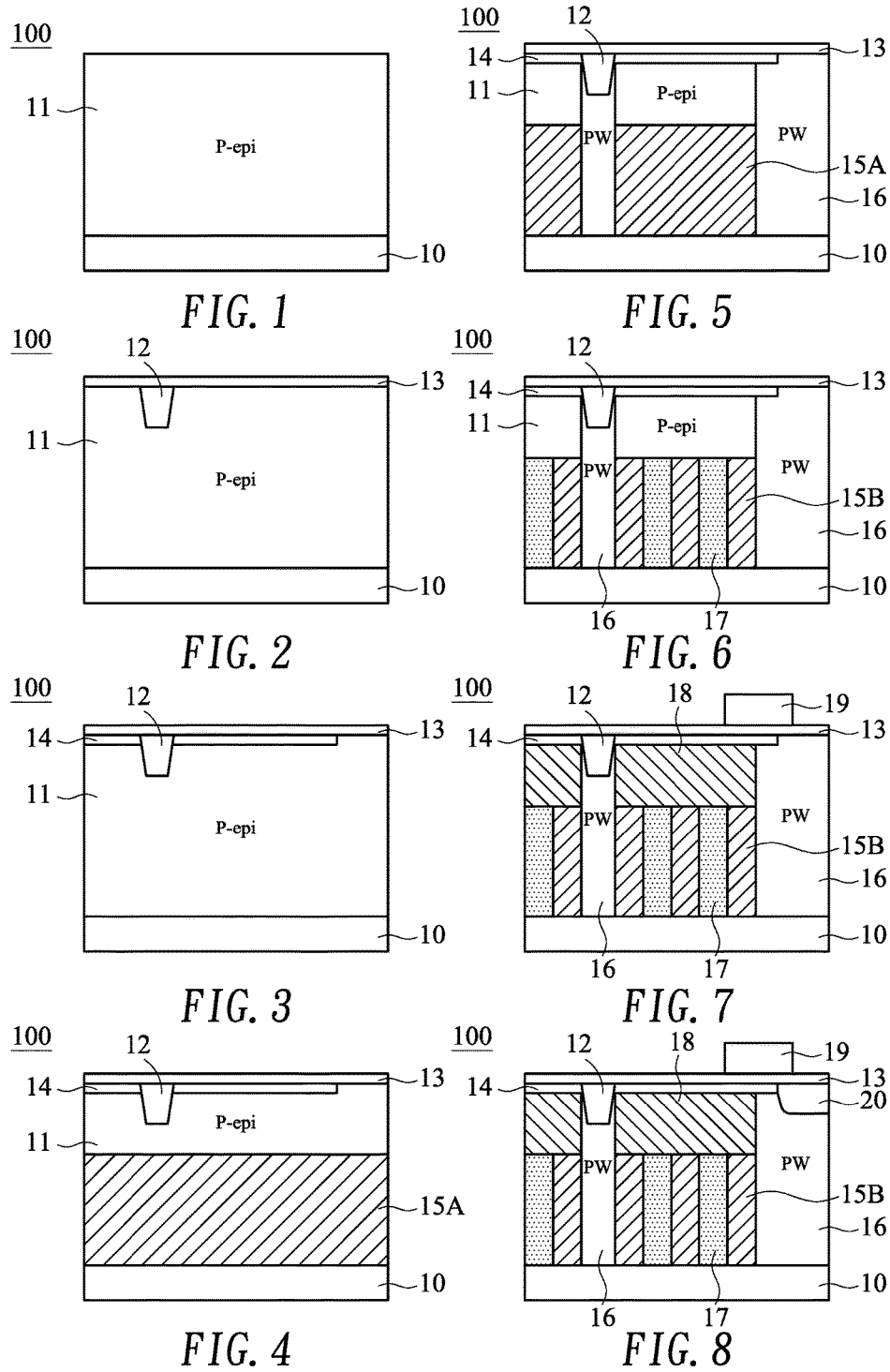

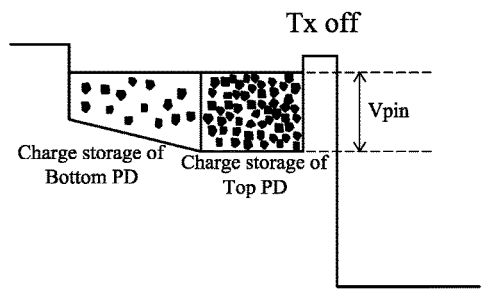
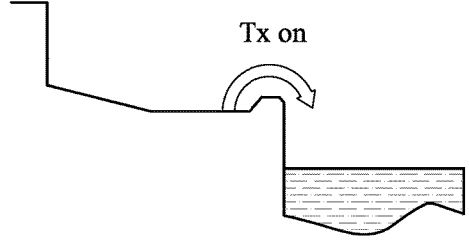
FIG. 10A
FIG. 10B
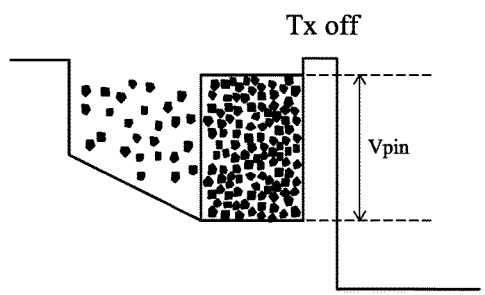
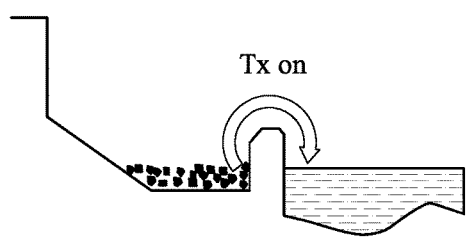
FIG. 11A
FIG. 11B
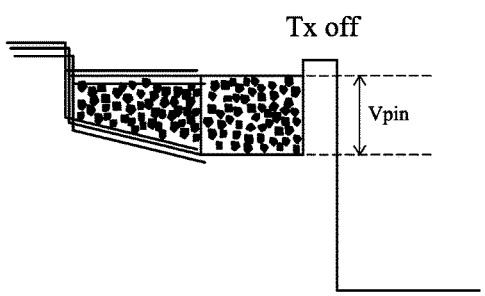
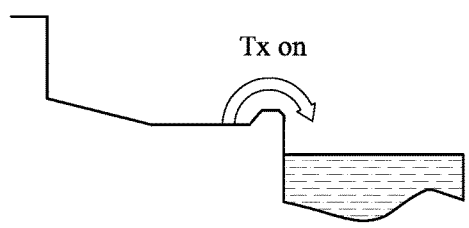
FIG. 12A
FIG. 12B

CMOS IMAGE SENSOR, A PHOTODIODE THEREOF AND A METHOD OF FORMING THE SAME

BACKGROUND OF THE INVENTION

1. Field of the Invention

The present invention generally relates to a CMOS image sensor, and more particularly to a CMOS image sensor with vertical-sub-photodiodes.

2. Description of Related Art

A complementary metal-oxide-semiconductor (CMOS) image sensor has been widely applied to mobile applications. The CMOS image sensor may be applied to other applications such as automotive and security applications. Requirements for the automotive and security applications are quite different from that for the mobile applications. For example, one strong request is high dynamic range (HDR), which is capable of capturing ultra dim and bright scenes at the same frame and with good quality.

Dynamic range (DR) of the CMOS image sensor may be classified into two types: one is intrinsic dynamic range (DR) that is determined by read noise and full well capacity (FWC), related to physical device and circuit capabilities; the other one is extended dynamic range (EDR) that may be achieved, for example, by multiple exposures and gains, etc. The intrinsic DR not only contributes to the final DR achieved, but is also important for reducing the side effects of EDR schemes. To obtain more intrinsic DR, there is a need to largely improve full well capacity (FWC) that defines the amount of charges an individual pixel can hold. A need has thus arisen to propose a novel CMOS image sensor with higher FWC pixel.

SUMMARY OF THE INVENTION

In view of the foregoing, it is an object of the embodiment of the present invention to provide a scalable (in terms of pixel size and process technology) solution for high full well capacity (FWC) pixel of a CMOS image sensor. The proposed CMOS image sensor may be adaptable to a front-side illuminated (FSI) CMOS image sensor or a backside illuminated (BSI) CMOS image sensor.

According to one embodiment, a photodiode (PD) of a CMOS image sensor includes a top PD of a second type and a bottom PD of the second type. The top PD is disposed in a first-type layer. The bottom PD is disposed in the first-type layer and below the top PD, and the bottom PD includes at least one sub-photodiode (sub-PD) of the second type connected to the top PD and at least one sub-well of the first type surrounded by the at least one sub-PD.

According to the embodiment, a CMOS image sensor includes a substrate; a bottom PD of a second type disposed above the substrate, the bottom PD including at least one sub-photodiode (sub-PD) of the second type; at least one sub-well of a first type disposed above the substrate and surrounded by the at least one sub-PD; a top PD of the second type disposed above the bottom PD, the top PD connecting the at least one sub-PD; a transfer-gate channel of the first type disposed above the top PD; a plurality of pixel wells of the first type disposed above the substrate, adjacent pixel wells defining a PD region composed of the top PD and the bottom PD; and an isolation region disposed above the substrate and between adjacent pixels.

According to another embodiment, a method of forming a CMOS image sensor is disclosed. A crystalline layer of a first type is formed on a substrate. An isolation region is formed in the crystalline layer, the isolation region being disposed between adjacent pixels. A transfer-gate channel of the first type is formed in an upper portion of the crystalline layer. A bottom photodiode (PD) layer of a second type is formed in a bottom portion of the crystalline layer. A plurality of pixel wells of the first type are formed in the crystalline layer, between adjacent pixel wells defining a PD region. At least one sub-well of the first type is formed in the bottom PD layer, the bottom PD layer not occupied by the at least one sub-well thereby resulting in at least one sub-photodiode (sub-PD) acting as a bottom PD of the PD region. A top PD of the second type is formed in a top portion of the crystalline layer, the top PD and the bottom PD constituting the PD region.

BRIEF DESCRIPTION OF THE DRAWINGS

FIG. 1 to FIG. 8 show cross-sectional views illustrated of a method of forming a complementary metal-oxide-semiconductor (CMOS) image sensor according to one embodiment of the present invention;

FIG. 10A and FIG. 10B show potential diagrams of a CMOS image sensor without sub-PD when the transfer gate (Tx) is turned off and turned on, respectively;

FIG. 11A and FIG. 11B show potential diagrams of another CMOS image sensor without sub-PD when the transfer gate is turned off and turned on, respectively;

FIG. 12A and FIG. 12B show potential diagrams of the CMOS image sensor with sub-PDs of FIG. 8 when the transfer gate is turned off and turned on, respectively;

FIG. 13B shows potential diagrams along a cut line A-A' and a cut line B-B' of FIG. 13A when the transfer gate is turned on; and FIG. 13C shows a potential diagram along a cut line C-C' of FIG. 13A when the transfer gate is turned on.

DETAILED DESCRIPTION OF THE INVENTION

Figure 9D:
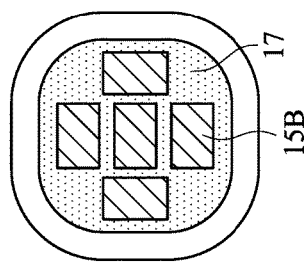
FIG. 9D show a bottom view of an exemplary configuration of the sub-PDs according to another embodiment of the present invention.

FIG. 1 to FIG. 8 show cross-sectional views illustrated of a method of forming a complementary metal-oxide-semiconductor (CMOS) image sensor 100 according to one embodiment of the present invention. The method of the embodiment may be adapted to forming a front-side illuminated (FSI) CMOS image sensor, and may be adapted to forming a backside illuminated (BSI) CMOS image sensor as well. It is appreciated that FIG. 1 to FIG. 8 show an exemplary but not exclusive process for forming the CMOS image sensor 100 as shown in FIG. 8. The sequence of performing the steps which result in the resultant CMOS image sensor 100 may be properly changed without departing from the scope of the present invention. For better understanding features of the embodiment, only primary elements or components pertinent to the embodiment are shown.

Referring to FIG. 1, a substrate 10 of a first type (e.g., P type) is provided. The substrate 10 may be a semiconductor substrate such as a silicon wafer. Subsequently, a crystalline layer 11 of the first type, such as a P-type epitaxial layer or P-epi, is formed on the substrate 10, for example, by a deposition process.

Referring to FIG. 2, an isolation region 12 such as shallow trench isolation (STI) is formed in the crystalline layer 11, and the isolation region 12 is disposed between adjacent pixels of the CMOS image sensor 100. On a top surface of the crystalline layer 11 may comprise an oxide (e.g., silicon dioxide) layer 13. As will be mentioned afterwards, the step of forming the isolation region 12 may be delayed until later, and the isolation region 12 may be a different type of isolation other than the STI.

Referring to FIG. 3, a transfer-gate channel 14 of the first type is formed in an upper (or near-surface) portion of the crystalline layer 11, for example, by an ion implantation process, therefore resulting in an implanted transfer-gate channel.

Referring to FIG. 4, a bottom photodiode (PD) layer 15A of a second type (e.g., N type), which is opposite to the first type, is formed in a bottom portion of the crystalline layer 11, for example, by an ion implantation process, therefore resulting in an implanted bottom PD layer. The implantation is performed at a high enough energy such that the bottom PD layer 15A is deep in the bottom portion of the crystalline layer 11. Multiple implantations with different energies are commonly required to form a desired depth profile. In another embodiment, the bottom PD layer 15A may alternatively or additionally be formed after forming the crystalline layer 11 but before forming the isolation region 12 (or the transfer-gate channel 14).

Referring to FIG. 5, a plurality of pixel wells (PWs) 16 of the first type are formed in the crystalline layer 11, for example, by a doping process. Each pixel well 16 extends from the transfer-gate channel 14 to a bottom surface of the crystalline layer 11. Between adjacent pixel wells 16 define a photodiode (PD) region that includes the bottom PD layer 15A disposed at the bottom and the crystalline layer 11 disposed at the top.

Referring to FIG. 6, at least one sub-well 17 of the first type is formed in the bottom PD layer 15A, for example, by an implantation process. The bottom PD layer 15A not doped with the sub-well 17 results in at least one vertical-sub-photodiode 15B acting as a bottom photodiode (PD). Similar to the bottom PD layer 15A, the implantation for the sub-well 17 is performed at a high enough energy such that the sub-well 17 is deep in the bottom portion of the PD region. Multiple implantations with different energies are commonly required to form a desired depth profile. It is appreciated that the pixel well 16 formed as shown in FIG. 5 may, for example, be formed alternatively after forming the sub-PD 15B. It is noted that the doping concentrations of the pixel well 16 and sub-well 17 can be the same or different.

Referring to FIG. 7, the crystalline layer 11 (of the first type) disposed at the top of the PD region is subjected to implantation of the second type, therefore resulting in a top photodiode (PD) 18 of the second type. All the sub-PDs (or bottom PDs) 15B and the top PD 18 constitute the entire PD region. In one embodiment, the top PD 18 and the at least one sub-PD (or bottom PD) 15B are properly graded doped from the sub-PD 15B to the top PD 18. Accordingly, transient time of charges may be substantially reduced such that photo carriers in the PD region can fast travel to the transfer-gate channel 14 to facilitate charge transfer.

Afterwards, a transfer gate 19 is formed above the crystalline layer 11 (e.g., on a top surface of the oxide layer 13). In the embodiment, the transfer gate 19 partially overlaps the transfer-gate channel 14. One edge (i.e., a first edge) of the transfer gate 19 partially overlaps the top PD 18.

Figure 9C:
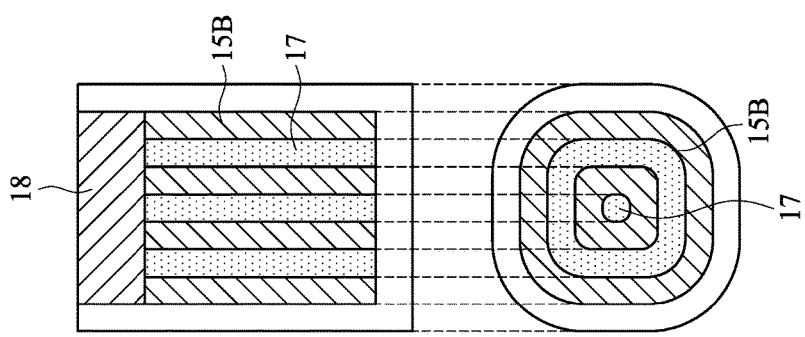
FIG. 9A to FIG. 9C show partial cross-sectional views and associated bottom views of some exemplary configurations of the sub-PD or sub-PDs according to embodiments of the present invention.
Figure 9B:
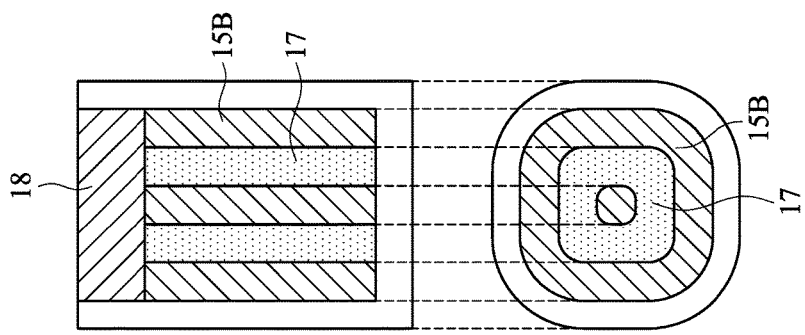
Figure 9A:
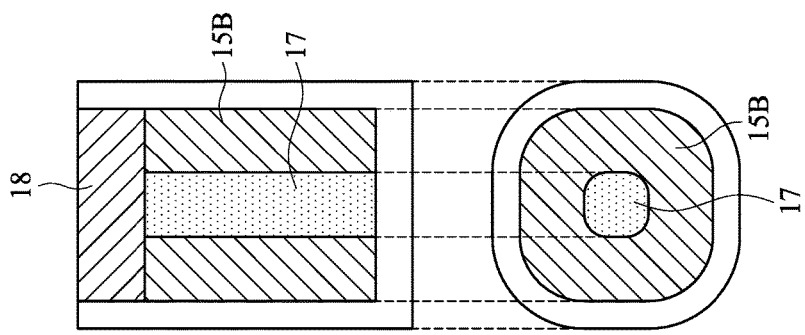

FIG. 9A to FIG. 9C show partial cross-sectional views and associated bottom views of some exemplary configurations of the sub-PD or sub-PDs (or bottom PD) 15B according to embodiments of the present invention. In FIG. 9A, a sub-well 17 is enclosed by a ring-shaped sub-PD 15B. In FIG. 9B, an inner sub-PD 15B is enclosed by a ring-shaped sub-well 17, which is further enclosed by an outer ring-shaped sub-PD 15B. In FIG. 9C, an inner sub-well 17 is enclosed by a ring-shaped sub-PD 15B, which is further enclosed by an outer ring-shaped sub-well 17, which is further enclosed by an outer ring-shaped sub-PD 15B. It is noted that the ring-shaped sub-PD 15B of the embodiment is symmetrical relative to a center of the bottom PD, and is beneficial to lens shading, color shading, and column and row fixed pattern noise. FIG. 9D show a bottom view of an exemplary configuration of the sub-PDs (or bottom PD) 15B according to another embodiment of the present invention. In this embodiment, the sub-PDs 15 are still symmetrical but not ring-shaped. However, it is not necessary that the sub-PD 15B should be symmetrical relative to the center of the bottom PD if a Deep Trench Isolation (DTI) is used.

Referring to FIG. 8, a transistor source and drain implantation process is performed, therefore resulting in a floating diffusion (FD) node 20 in an upper portion of the pixel well 16. The FD node 20 abuts the transfer-gate channel 14. Another edge (i.e., a second edge that is opposite the first edge) of the transfer gate 19 partially overlaps the FD node 20.

Generally speaking, a photodiode (PD) of a CMOS image sensor 100 according to the embodiment may include a top PD 18 of a second type disposed in a first-type layer (e.g., the crystalline layer 11); and a bottom PD of the second type disposed in the first-type layer and below the top PD 18, the bottom PD including at least one sub-photodiode (sub-PD) 15B of the second type connected to the top PD 18.

According to the embodiment discussed above, as area (junction capacitance) of the bottom PD increases due to the plural vertical side walls of the at least one sub-PD 15B, charge storage density of the CMOS image sensor 100 increases accordingly for a given Vpin as defined in FIG. 10A. Further, the high junction capacitance area helps to meet the request that pinning voltage of the at least one sub-PD 15B is lower than the top PD 18 for charge transfer purpose.

The area of vertical side walls may be scaled with depth of the bottom PD 15B and/or the amount of the sub-PDs 15B. Therefore, more full well capacity (FWC) can be achieved by more advanced process technology that is capable of handling deeper PD or forming more sub-PDs 15B (or sub-wells 17).

Moreover, as the outer depletion side wall (as denoted by 131 in FIG. 13A) encloses the whole PD region, the strong electrical field will prevent the charges generated inside one PD from escaping to a neighboring PD, therefore good photodiode quantum efficiency (QE) can be achieved. Although crosstalk happens within the ring-shaped sub-PDs (or bottom PD) 15B, as all sub-PDs 15B are eventually connected to the top PD 18, the crosstalk is internal but not pixel-to-pixel.

It is further noted that if deep trench isolation (DTI) is adopted for the isolation region 12, the impact on the quantum efficiency (QE), crosstalk and symmetry of the bottom PD 15 becomes less stringent.

FIG. 10A and FIG. 10B show potential diagrams of a conventional CMOS image sensor without sub-PD 15B (that is, the entire PD region is solid without pixel well 17 in it) when the transfer gate (Tx) is turned off and turned on, respectively, where Vpin represents pinning voltage. FIG. 11A and FIG. 11B show potential diagrams of another CMOS image sensor without sub-PD 15B when the transfer gate is turned off and turned on, respectively. It illustrates the conventional way to increase FWC by increasing doping level of PD 18 and 15A The photodiode implants of the CMOS image sensor in FIG. 11A/11B is larger than that in FIG. 10A/10B. It is observed that, the CMOS image sensor in FIG. 11A/11B has poorer charge transfer than that in FIG. 10A/10B because of higher barrier and lower voltage drop, although more charge is accumulated in the photodiode of FIG. 11A/11B. FIG. 12A and FIG. 12B show potential diagrams of the CMOS image sensor 100 with sub-PDs 15B of FIG. 8 when the transfer gate 19 is turned off and turned on, respectively. As stated above, increased junction capacitance area of vertical side walls of the at least one sub-PD 15B enhances charge storage density of the CMOS image sensor 100, and the charge storage density in the at least one sub-PD 15B of FIG. 12A/12B is thus higher than that of FIG. 10A/10B. Therefore, higher full well capacity (FWC) can be achieved in the CMOS image sensor 100 of the embodiment.

Figure 13A:
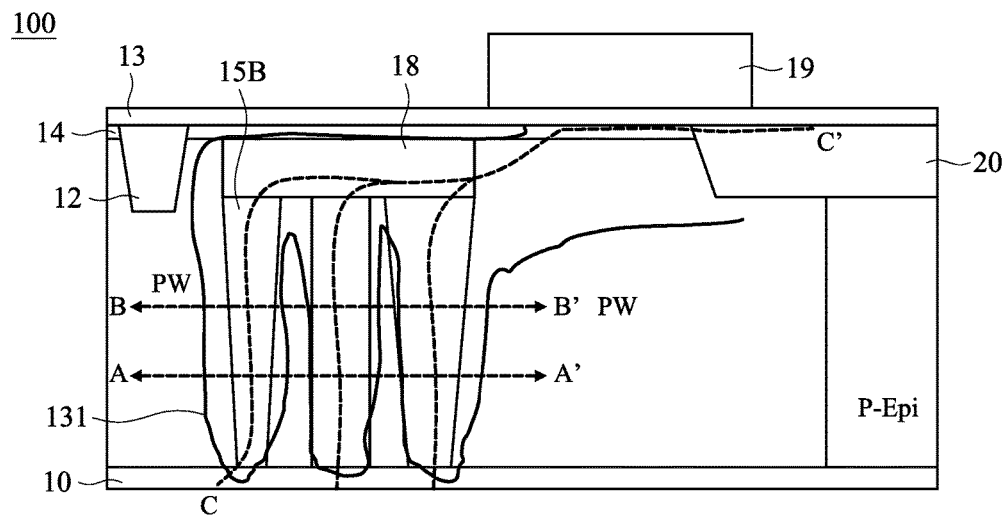
FIG. 13A shows a cross-sectional view of a CMOS image sensor according to one embodiment of the present invention.
Figure 13B:
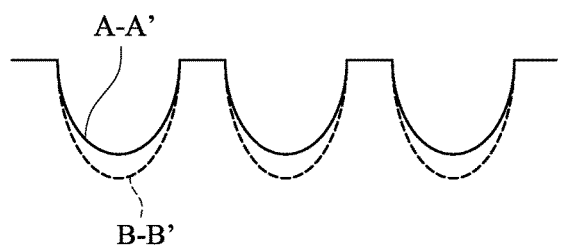
Figure 13C:
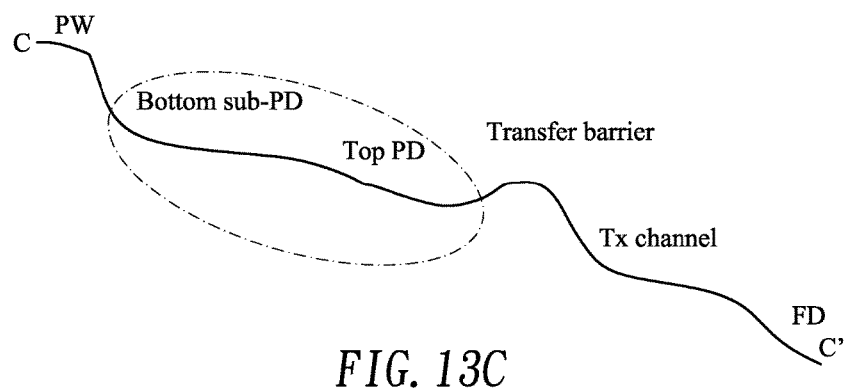

FIG. 13A shows a cross-sectional view of a CMOS image sensor 100 according to one embodiment of the present invention, and FIG. 13B shows potential diagrams along a (dotted) cut line A-A' and a cut line B-B' of FIG. 13A when the transfer gate 19 is turned on. FIG. 13C shows a potential diagram along a cut line C-C' of FIG. 13A when the transfer gate 19 is turned on. Specifically, FIG. 13C illustrates a potential profile from the bottom PD 15B, via the top PD 18 and the transfer-gate channel 14, to the FD node 20. A graded potential profile inside the bottom PD 15B and the top PD 18 for smooth charge transfer can be achieved mainly by properly arranging doping concentrations of the bottom PD 15B and the top PD 18.

Although specific embodiments have been illustrated and described, it will be appreciated by those skilled in the art that various modifications may be made without departing from the scope of the present invention, which is intended to be limited solely by the appended claims.

What is claimed is:

1. A complementary metal-oxide-semiconductor (CMOS) image sensor, comprising:
    a substrate;
    a bottom PD layer disposed on the substrate, the bottom PD layer including at least one n-type sub-photodiode (sub-PD) disposed on the substrate;
    at least one p-type sub-well included in the bottom PD layer and disposed on the substrate, the sub-well being surrounded by the at least one sub-PD;
    an n-type top PD disposed on the bottom PD layer, the top PD directly connecting the at least one sub-PD physically and electrically;
    a p-type transfer-gate channel disposed above the top PD;
    a plurality of p-type pixel wells disposed on the substrate, adjacent pixel wells defining a PD region composed of the top PD and the bottom PD layer; and
    an isolation region disposed above the substrate and between adjacent pixels;
    wherein a top surface of the at least one sub-PD physically abuts a bottom surface of the top PD, and a bottom surface of the at least one sub-PD physically abuts a top surface of the substrate; and
    a top surface of the at least one sub-well physically abuts the bottom surface of the top PD, and a bottom surface of the at least one sub-well physically abuts the top surface of the substrate.

2. The CMOS image sensor of claim 1, further comprising:
    a transfer gate disposed above and partially overlapping the transfer-gate channel; and
    a floating diffusion (FD) node disposed in an upper portion of the pixel well, the FD node abutting the transfer-gate channel.

3. The CMOS image sensor of claim 2, wherein a first edge of the transfer gate partially overlaps the top PD, and an opposite second edge of the transfer gate partially overlaps the FD node.

4. The CMOS image sensor of claim 1, wherein the at least one sub-PD is ring-shaped.

5. The CMOS image sensor of claim 1, wherein the at least one sub-well is enclosed by a ring-shaped sub-PD.

6. The CMOS image sensor of claim 1, wherein the at least one sub-PD is symmetrical relative to a center of the bottom PD layer.

* * * * *